(12) United States Patent  
Hsu et al.

(10) Patent No.: US 6,975,140 B2  
(45) Date of Patent: Dec. 13, 2005

(54) ADAPTIVE DATA TRANSMITTER HAVING REWRITEABLE NON-VOLATILE STORAGE

(75) Inventors: Louis L. Hsu, Fishkill, NY (US); Brian L. Ji, Fishkill, NY (US); William F. Washburn, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 10/707,199

(22) Filed: Nov. 26, 2003

(65) Prior Publication Data

US 2005/0111567 A1    May 26, 2005

(51) Int. Cl.[7] ......................................... H03H 19/0175

(52) U.S. Cl. .................... 326/82; 379/390.02
(58) Field of Search .................... 326/82; 341/144; 379/390.02

(56) References Cited

U.S. PATENT DOCUMENTS

| | | | |
|---|---|---|---|
| 5,519,398 A | 5/1996 | Satoh et al. |
| 5,974,528 A | 10/1999 | Tsai et al. |
| 6,009,496 A | 12/1999 | Tsai |
| 6,049,222 A | 4/2000 | Lawman |
| 6,266,379 B1 | 7/2001 | Dally |

*Primary Examiner*—Don Le  
(74) *Attorney, Agent, or Firm*—Daryl Neff

(57) ABSTRACT

A data transmitter and transmitting method are provided in which an adaptive finite impulse response (FIR) driver has a plurality of taps to which coefficients having updateable values are applied. The FIR driver has a transfer function between an input stream of data bits and an output stream of data bits such that each data bit output from the FIR driver has an amplitude adjusted as a function of the values of a plurality of data bits of the input stream, and the values of the coefficients. The data transmitter includes a rewriteable non-volatile storage, operable to be rewritten with control information representing the values of the coefficients updated during operation of the FIR driver.

24 Claims, 7 Drawing Sheets

ADAPTIVE DATA TRANSMITTER HAVING REWRITEABLE NON-VOLATILE STORAGE

BACKGROUND OF INVENTION

In transmitting high-speed data signals having switching rates above 500 MHz over conductive lines, the effects of attenuation and inter-symbol interference impact reception much more strongly than at lower frequencies, such that special measures are needed to address these problems. Special measures may be used to improve impedance matching between the transmitter or the receiver and the conductive lines carrying the signal. Special measures may also be used to improve receiver bandwidth, such as those described in co-pending, commonly owned U.S. patent application Ser. No. 10/250,043 filed May 30, 2003.

However, use of special impedance matching and receiver measures alone may not be sufficient to permit high-speed signals on conductive lines to be properly received. The characteristics of signal channels can vary widely, despite efforts to make them uniform. For example, certain high-speed serial links are intended for communications between one board and another on rack systems having backplanes. The length and characteristics of communication paths in such systems can vary widely depending upon the positions of boards within a rack and whether the communication path goes between one rack and another. Variations become even greater in systems where transmitters having the same serial link design support a variety of selectable transmission frequencies and signaling protocols. Attenuation can vary by an order of magnitude or more in such systems. In such systems, the transmitter itself may need to provide adaptive equalization to the channel it drives.

Data transmitters are known which have adaptively equalized signal drivers. Some types of data transmitters include a finite impulse response (FIR) driver. A FIR driver is a driver which outputs data bits at amplitudes determined as a function of the values of a finite series of data bits, especially the input data bits to the driver. A FIR driver is a driver having a FIR filter function. A FIR driver typically includes a tapped delay line for performing a time domain convolution of a series of input data bits with a set of variable coefficients applied to the taps, the coefficients determining the weight of each bit of the series in a sum which determines the amplitude of the current output bit of the FIR driver. In FIR drivers, the values of the coefficients are generally fixed at the time of post-production testing, and sometimes earlier, at the time of design. Some FIR drivers are capable of modifying the values of the coefficients during operation to adaptively adjust the response of the filter to particular operating conditions. While such capability is desirable, much power and time is consumed when a FIR driver cycles through settings to settle on a set of suitable coefficient values. Therefore, cycling through settings to determine coefficient values is to be avoided, except when transmission and reception conditions change, requiring new coefficient values to be determined.

Accordingly, U.S. Pat. No. 5,519,398 issued May 21, 1996 to Satoh et al. describes a FIR filter which utilizes a "look-up table" of coefficient values stored in an eraseable programmable read only memory (EPROM). Upon powering up the FIR filter, the coefficient values are stored to the taps of the FIR filter as initial settings from the coefficient values stored in the EPROM. In this way, the FIR filter has a set of initial coefficient values which, hopefully, provide a starting point of operation for determining coefficient values appropriate for particular operational conditions under which the FIR filter is currently used. However, such look-up table can only be erased and rewritten by external intervention requiring illumination of the EPROM with ultraviolet light. The provision of a look-up table does not avoid the FIR filter from cycling through settings to determine appropriate coefficient values each time it is powered up, since the particular operating conditions vary in use. Because of that, such arrangement is undesirable for use in high-speed transmission systems such as those described above where operating conditions for each communication path vary widely.

In U.S. Pat. No. 6,266,379 B1 issued Jul. 24, 2001 to Dally, the coefficients of a FIR transmitter having a tapped delay line are stored during operation in a dynamic random access memory (DRAM) or static random access memory (SRAM). When powered off, DRAMs and SRAMs do not retain stored information. Thus, every time the transmitter is powered up, the coefficient values must be transferred from permanent storage to the DRAM or SRAM, resulting in delay for using the transmitter and/or a performance trade-off. Moreover, if the permanent storage is provided in ROM or EPROM and contains fixed initial values such as those described in the above referenced '398 Patent to Satoh et al., the FIR transmitter must again cycle through settings before reaching coefficient values appropriate to the prevailing operating conditions.

Therefore, it would be desirable to provide an adaptive data transmitter in which control information representing the values of the coefficients applied to taps of the data transmitter are updated and stored non-volatily.

It would further be desirable to operate the adaptive data transmitter upon powering up using the non-volatily stored control information.

SUMMARY OF INVENTION

According to an aspect of the invention, a data transmitter is provided in which an adaptive finite impulse response (FIR) driver has a plurality of taps to which coefficients having updateable values are applied. The FIR driver has a transfer function between an input stream of data bits and an output stream of data bits such that each data bit output from the FIR driver has an amplitude adjusted as a function of the values of a plurality of data bits of the input stream, and the values of the coefficients. The data transmitter includes a rewriteable non-volatile storage, operable to be rewritten with control information representing the values of the coefficients updated during operation of the FIR driver.

According to another aspect of the invention, a method of transmitting a stream of data bit signals is provided in which each data bit signal has an amplitude adjusted in relation to the values of the data bits being transmitted. According to such aspect, an input stream of data bits is applied to an input of an adaptive finite impulse response (FIR) driver, the FIR driver including a plurality of taps to which coefficients having updateable values are applied. Data bit signals are driven by the FIR driver at amplitudes determined as a function of the values of a plurality of the data bits input to the FIR driver and the values of the coefficients.

During operation of the FIR driver, the values of the coefficients applied to the taps are updated. Control information representing the updated values of the coefficients is stored in a rewriteable non-volatile storage. When powering up the FIR driver after from a powered down state, the control information is retrieved from the storage for applying the updated values of the coefficients to the taps.

DETAILED DESCRIPTION

Figure 1:
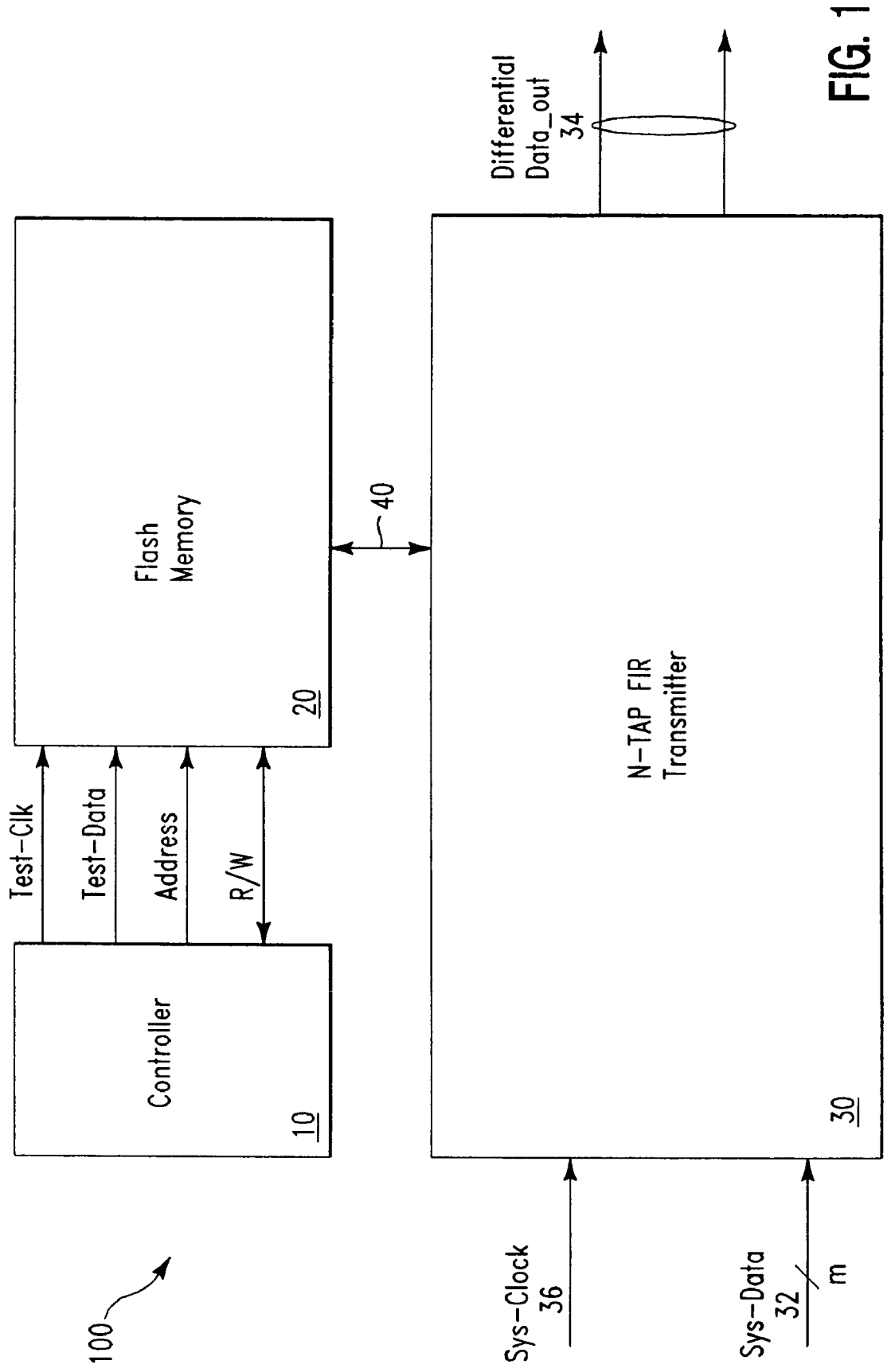
FIG. 1 is a block and schematic diagram illustrating a data transmitter according to an embodiment of the invention.

An adaptive data transmitter according to an embodiment of the invention is illustrated in FIG. 1. As shown therein, the data transmitter 100 includes a finite impulse response (FIR) transmitter 30, having a number n of taps. To each tap a coefficient is applied, wherein the coefficients at least partly define the transfer function of the FIR transmitter 30 between an input stream of data bits 32 and an output stream of data bits 34. In a preferred embodiment, the input stream of data bits is preferably a parallel stream of a number m of data bits clocked by a clock input 36 to the FIR transmitter 30. The output stream of data bits need not be clocked by a separate clock signal. The output stream of data bits is preferably a serial stream transmitted as differential signals on a pair of conductors coupled to the FIR transmitter 30.

The adaptive data transmitter further includes a flash memory 20. The flash memory 20 provides a rewriteable non-volatile storage operable to store the values of coefficients used in the taps of the FIR transmitter. Updated values of the coefficients used in the taps of the FIR transmitter 30 are determined and stored to the flash memory 20 during operation of the FIR transmitter. When the FIR transmitter is powered off and back on again, the coefficient values as last updated are available to be retrieved from the flash memory 20 and applied to the taps of the FIR transmitter again. Arrows 40 indicate the transfer of values, such as the tap coefficients, in both directions between the flash memory 20 and the FIR transmitter 30.

Flash memory is a non-volatile random access memory (NVRAM) suitable for use as the rewriteable non-volatile storage to store updated control information for operating the FIR transmitter. Other suitable types of NVRAM include magneto-resistive random access memory (MRAM), memory based on metal-oxide-nitride-oxide-silicon (MONOS) devices, and Chalcognide RAM. Among such types of NVRAM, Chalcognide RAM, also called phase-change RAM, is relatively new. In Chalcognide RAM, write and erase operations are performed by changing the phase of a film from crystalline (lower resistance) to amorphous (higher resistance), by applying a voltage at a particular level and duration. Any type of NVRAM can be used as the rewriteable non-volatile storage, so long as such NVRAM is of the type suitable for integration on an integrated circuit chip.

The rewriteable non-volatile storage is preferably embedded in the same integrated circuit chip on which the FIR transmitter is provided, for example, as an embedded flash memory. Alternatively, in another embodiment, the rewriteable non-volatile storage can be provided in a package on an integrated circuit chip which is closely coupled to the integrated circuit on which the transmitter is provided. For example, a flash memory, MRAM or other type of NVRAM can be provided on a chip other than the chip containing the transmitter, and the two chips bonded together in the same microelectronic package. In such example, the chips can be mounted on a multi-layer substrate, or on a chip carrier having a dielectric element and traces on the chip carrier interconnecting the chips. In another example, the chips are mounted together on a third chip containing passive elements. Alternatively, the chips are mounted to each other in either a face-up arrangement or flip-chip attached.

In the description that follows, reference is made to specific embodiments in which the rewriteable non-volatile storage is a flash memory. The use of other types of NVRAM in place of the flash memory shall be understood. As shown in FIG. 1, a controller 10 operates the flash memory 20 through a set of lines providing read and write control input, address input, test data input and a test clock input. The controller 10 generates the address input and read and write control input to the flash memory 20. The controller 10 controls the storing of updated coefficient values and other control information for the FIR transmitter, as used in operation by the various elements of the FIR transmitter, as well as the storing of coefficient values and other control information for the FIR transmitter from the results of calibration testing and the like. The controller 10 also controls the retrieval of the coefficient values and the other control information for the FIR transmitter from locations determined by the address input.

Figure 2:
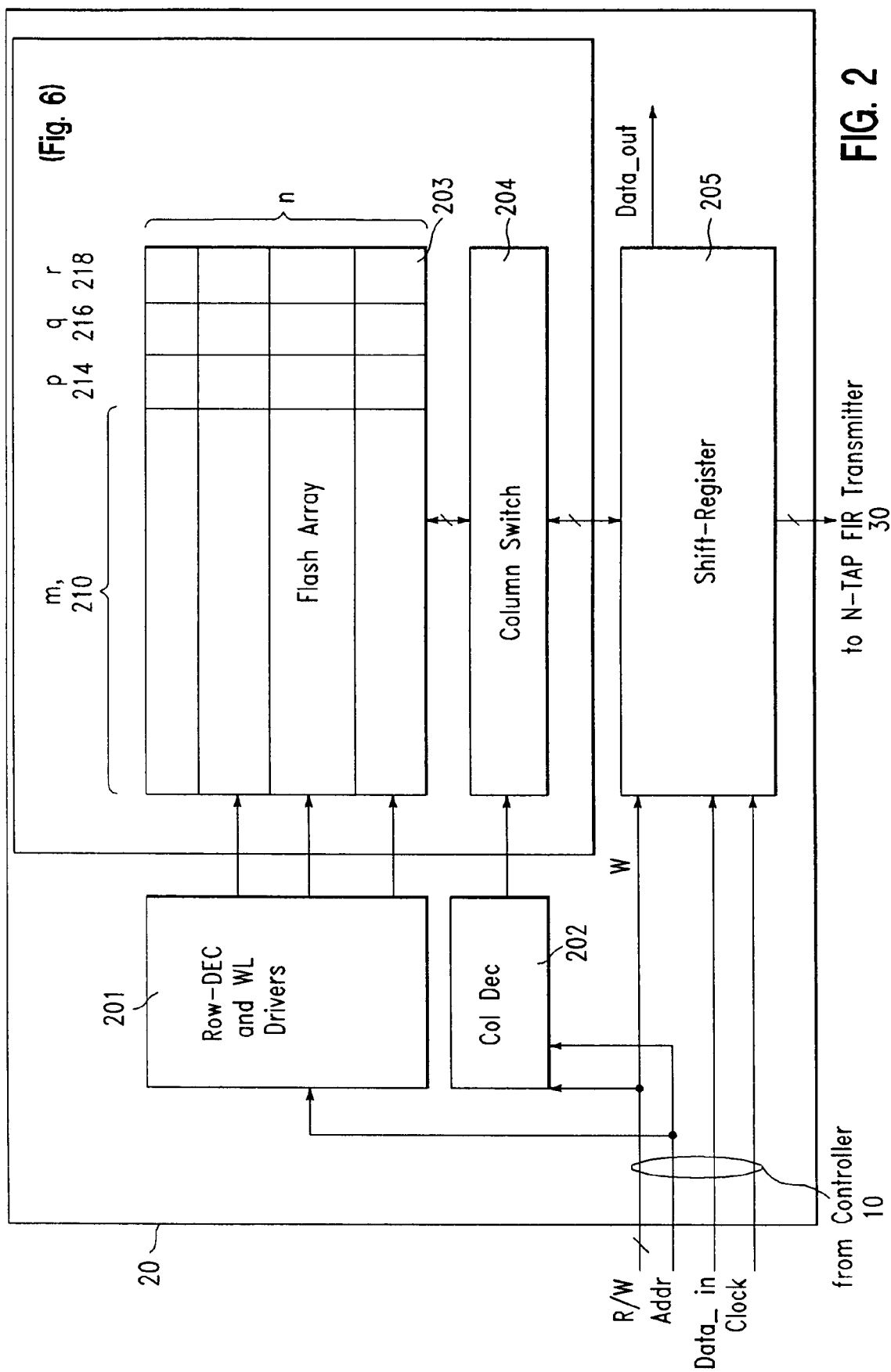
FIG. 2 is a block and schematic diagram illustrating a flash memory component of a data transmitter according to an embodiment of the invention.

The structure and function of the flash memory 10 are further described with reference to FIG. 2. As shown therein, the flash memory 20 includes a flash memory array 203, a row decoder and wordline driver 201, a column decoder 202, a column switch unit 204, and a shift register 205 providing first-in-first-out (FIFO) operation.

The flash memory array 203 includes a number n of rows accessed by wordlines (not shown) and many columns which are accessed by bitlines (also not shown). The wordlines are driven by wordline drivers of the row decoder and wordline driver unit 201. The columns are accessed through sense amplifiers (not shown) and the column switch unit 204. The column switch unit 204 is used to select one or more columns upon each read access to direct the data read from the flash memory array 203 to the shift register 205. Upon each write access, the column switch unit 204 directs data held in the shift register to one or more columns of the flash memory array 203.

The number n of rows of the flash memory array matches the number of taps of the FIR driver. The columns are partitioned into different zones having numbers of columns designated as m, p, q, and r, as shown in FIG. 2. Each of the zones contains one or more columns. In an embodiment, each zone is used to store control information for controlling a different function than the control information that is stored in other zones. In such manner, a zone 210 stores a quantity m×n of control information, other zones 214 and 216 store quantities p×n and q×n of control information, respectively and another zone 218 stores a quantity r×n of control information. The zones 210, 214 and 216 store control information representing the coefficients to be applied to the taps of the FIR transmitter. Specifically, the zone 210 stores control information representing the relative magnitude of each coefficient. The number m determines the weight resolution of each coefficient to be applied to the taps of the FIR transmitter 30. Zone 216 stores control information representing a sign of each coefficient. Zone 214 stores control information representing a power level applied to all of the taps of the FIR transmitter 30. The number p determines a number of power levels to which the FIR transmitter 30 can be set through updateable control information stored in the flash memory array 203. The provision of adjustable power levels allows transmitter output power to be reduced in order to decrease near end cross-talk. Conversely, transmitter output power can be increased when appropriate to counter attenuation effects on longer cable runs between transmitter and receiver. Zone 218 stores control information for operating a termination network and impedance matching network, as will be described with reference to FIG. 3 below.

The shift register 205 operates in both parallel and serial modes. The shift register holds information for parallel transfer to and from the flash memory array 203 through the column switch 204. The shift register holds information for parallel transfer to the FIR transmitter 30 as well. In addition, the shift register 205 receives data inputted serially as Data_in, as timed by a clock signal input to the shift register 205. The shift register also outputs data serially as Data_out, such as for test purposes.

When the values of coefficients applied to the taps of the FIR transmitter 30 are updated, as by performing calibration testing, m bits of control information representing the magnitude of each coefficient and q bits of control information representing the sign of each coefficient are inputted to the shift register 205 serially as Data_in. At such time, updated control information including the p bits representing the transmitter power level, and r bits representing the termination and impedance control bits is also inputted to the shift register 205. After inputting the updated control information, the control information is available at the output of the shift register 205 for control of the FIR transmitter 30. Meanwhile, the updated control information is also stored to the flash memory array 203 through the column switch unit 204 under control of the controller 10 (FIG. 1).

Operation of the flash memory 20 proceeds as follows. When an address is received from the controller 10, a write operation is performed to the flash memory array 203. Data is then inputted serially into the shift register 205 from signal Data_in, where it is then available to be subsequently stored to the flash memory array 203. When read control input is received, the information stored in the flash memory array is read out to the shift register through the column switch 204. From the shift register 205, the retrieved information is then available for output to the FIR transmitter 30 or to be outputted serially as Data_out, for a test purpose, for example.

Figure 3:
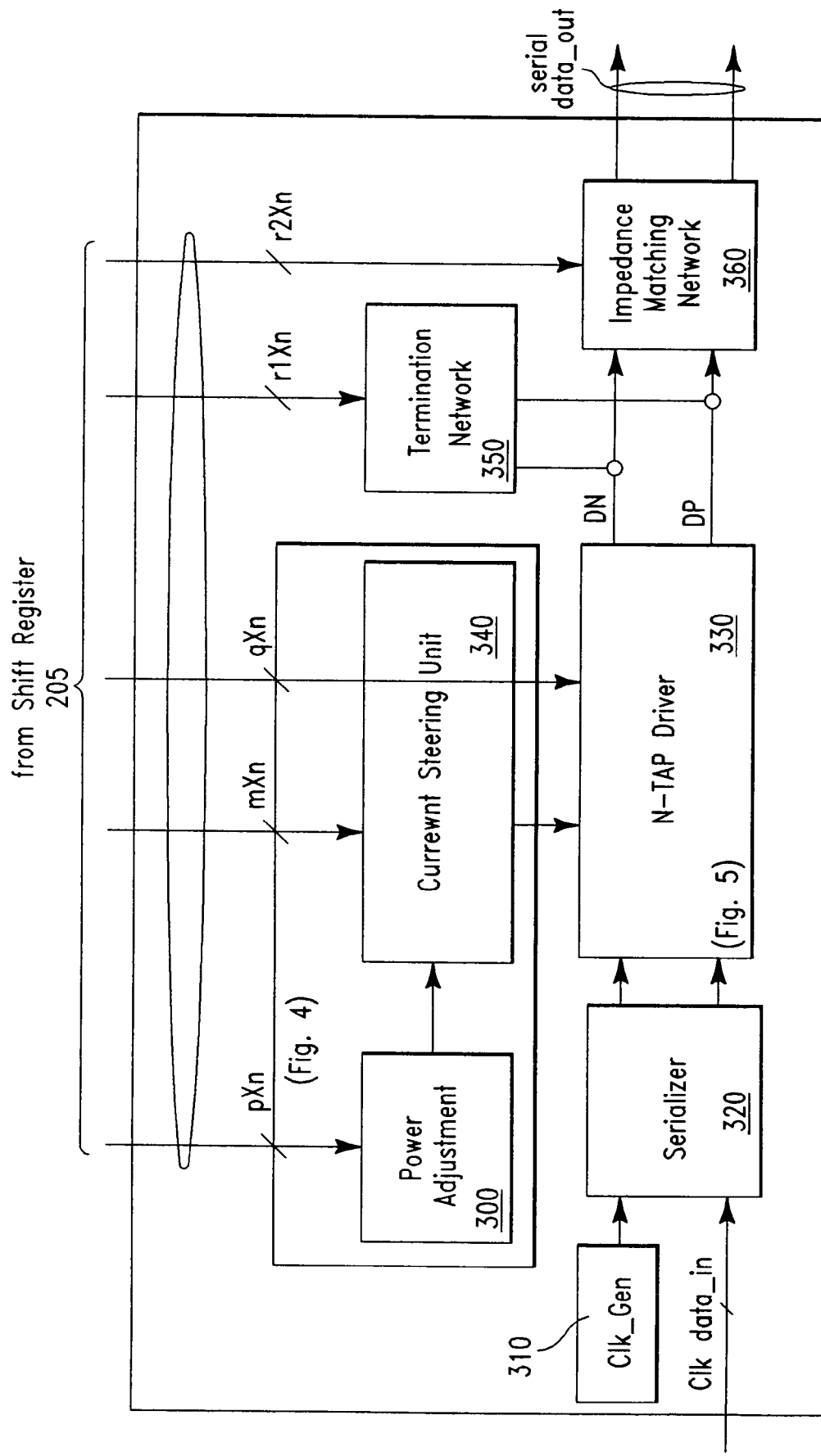
FIG. 3 is a block and schematic diagram illustrating a finite impulse response (FIR) transmitter component of a data transmitter according to an embodiment of the invention.

FIG. 3 is a block and schematic diagram illustrating the FIR transmitter 30 portion of the data transmitter. As shown therein, the FIR transmitter 30 includes an N-tap FIR driver 330, a serializer 320 and a clock generator 310 at an input end thereof. The serializer 320 outputs a serialized stream of data bits to the FIR driver 330 from a parallel stream of a number k of data bits input to the serializer 320, as timed by a clock output of the clock generator 310. At the output end of the FIR transmitter 30, a termination network 350 and an impedance matching network 360 are provided. A current steering unit 340 having a power adjustment unit is coupled to the FIR driver 330 for providing n output currents representing the coefficients of the taps of the FIR driver 330. The output currents are provided at magnitudes programmably adjusted in relation to the m×n bits of control information, one output current to each tap of the FIR driver. The FIR driver 30 is also coupled to receive q×n of bits representing the sign of each coefficient from the shift register 205.

The power adjustment unit 300 is used to determine an overall power level for the FIR driver 330, through level control applied uniformly to the currents output by the current steering unit 340, in accordance with the p×n control information bits that are input to the power adjustment unit 300. Individual control over the magnitude of each current representing a tap coefficient is provided by the m×n control information bits. This is more fully described below, with reference to FIG. 4.

The outputs of the FIR driver 330 are a pair of differential signals DN and DP representing one serially transmitted signal which is carried on a pair of signal conductors. The termination network 350 and impedance matching network 360 at the output end of the FIR transmitter 300 are used together to apply a programmably matched impedance to the impedance that appears to the conductors carrying the output of the FIR driver 330, as will be described further below with reference to FIGS. 6 and 7. In an embodiment, the termination network 350 includes impedance elements having primarily a resistive impedance, i.e. resistors, while the impedance matching network includes impedance elements having primarily a reactive impedance such as inductors and capacitors.

Figure 4:
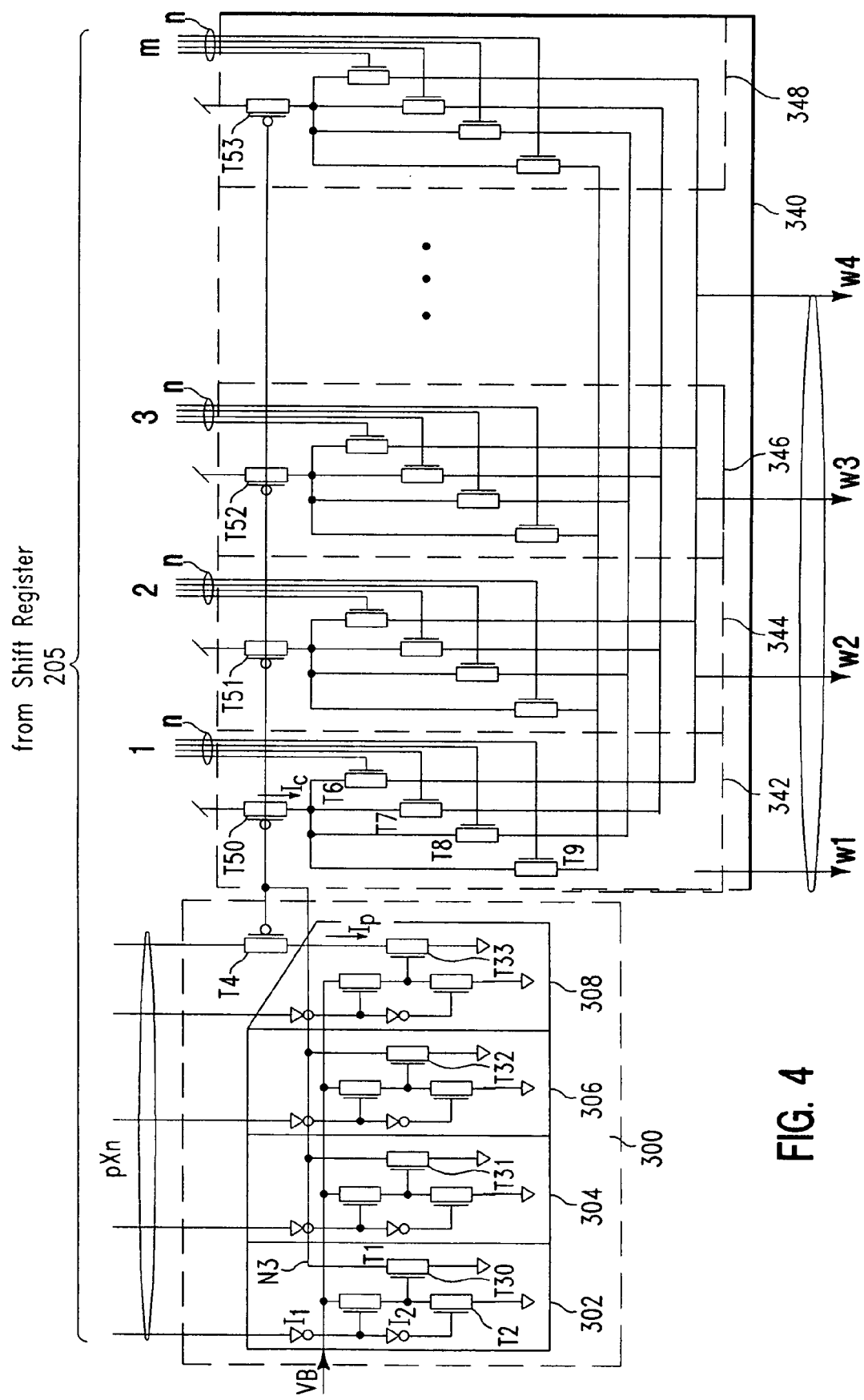
FIG. 4 is a schematic diagram illustrating a power adjustment unit and a current steering unit, components of a data transmitter according to an embodiment of the invention.

An exemplary current steering unit 340 and power adjustment unit 300 are illustrated in the schematic diagram of FIG. 4. Both the current steering unit and the power adjustment unit 300 include current mirror circuits which are operable to generate currents having magnitudes which are programmably adjustable in relation to control information bits provided to these circuits. The power adjustment unit 300 produces a bias current $I_P$ which is mirrored to the current steering unit 340 as $I_C$. That bias current is mirrored to a number m of PFETs T50, T51, T52, etc., of the current steering unit 340 as a current $I_C$ flowing through each PFET, as will be described more fully below. Such bias current is generated through the current mirroring arrangement shown at 300.

A number p×n of control information bits are input to the power adjustment unit for turning certain transistors on or off to produce the bias current $I_P$ to control the transmitter power level. In an example of operation, one of the p×n control information bits is input as a "0" to inverter I1 turns on a transistor T1. That bit is inverted by inverter I2, such that a second transistor T2 is turned off. Under such condition, the voltage at the gate of transistor T30 becomes high, turning on T30, which then draws a current. The current through T30 contributes to the total current $I_P$ that is drawn at the final stage of the circuit. Each of the current mirror circuits 302, 304, 306 and 308 operate in a similar manner, such that the more of the p bits input thereto that are high, the larger the value of the current $I_P$. The mirror devices T30, T31, T32 and T33 have different sizes such that each of the transistors is twice as large as the next smaller one. In such manner, the current though T33 is twice a large as the current through T32, which in turn, is twice as large as the current through T32, and so on. In all, $2^{(p \times n)}$ power levels can be provided by the power adjustment unit.

In the current steering unit 340, the $I_C$ current mirrors the $I_P$ current from the power adjustment unit 300, as do the currents which are drawn by each of the PFETs T51, T52, T53, etc. of a number m of current steering circuits 342, 344, etc. When the $I_C$ current is higher, the PFETs T50, T51, etc. are biased to conduct a greater amount of current. Conversely, when the $I_C$ current is lower, the PFETs T50, T51, etc. are biased to conduct a smaller amount of current. The current steering unit also receives a plurality of control information bits in a quantity m×n for adjusting the relative magnitudes of currents which are applied as coefficients to each of the n taps of the FIR driver 330. The current steering unit 340 includes a number m of circuits 342, 344, 346 and 348, each of which functions to gate or not gate a predetermined amount of current to each of n nodes w1, w2, w3 and w4. Each of the m circuits 342, 344, 346, etc., operate to switch on or off the flow of current from a current source $I_C$. At each node w1, w2, w3, and w4, the outputs of all m circuits are combined, such that there are m levels of current that can be output at a node w1, w2, etc., as determined by the m×n control information bits input to circuit 340. The higher the number m, the greater the granularity of levels to which each coefficient of the FIR driver 330 can be set.

For example, at circuit 342, a number n of bits is applied to the gates of transistors T6, T7, T8 and T9 for operating the transistors. In this example, n equals four, such that there are four bits applied to four transistors of each circuit. The same number n of bits are applied to the transistors of all the m circuits 342, 344, etc., that are provided. In each circuit, the first bit determines whether the current flow is switched on for the first output node w1. The second bit determines whether the current flow is switched on for the second output node w2, and so on. Thus, for a particular output node w1, the current flow can be switched on through all m circuits to provide the maximum output current. In another example, for a particular output node, e.g., w2, the current flow can be switched on in only a number y of the circuits (y<m) to provide a current having an adjusted magnitude for output.

Figure 5:
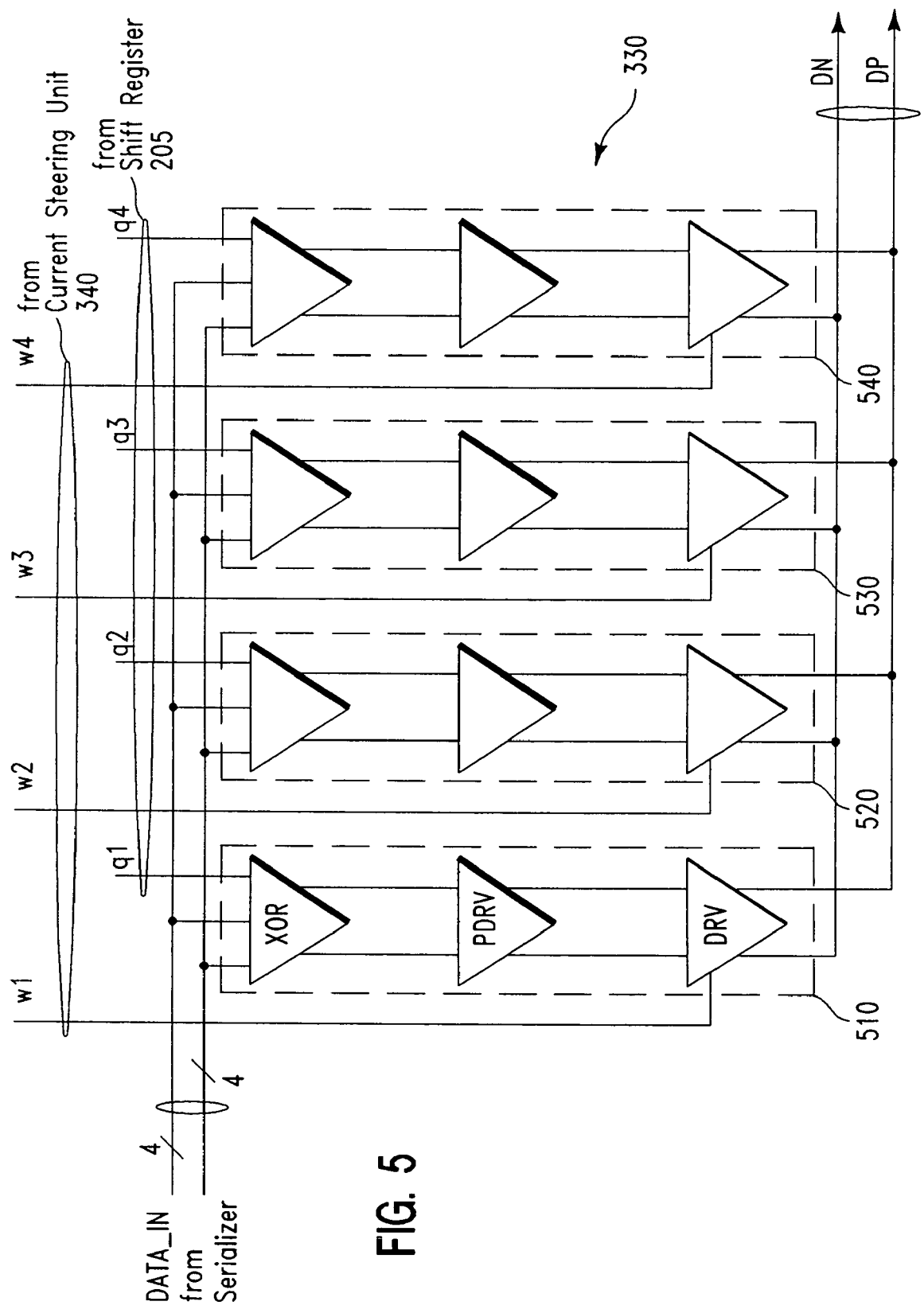
FIG. 5 is a schematic diagram illustrating a finite impulse response (FIR) driver component of a data transmitter according to an embodiment of the invention.

The FIR driver 330 is schematically illustrated in FIG. 5. As illustrated, in a particular embodiment, the FIR driver 330 has four taps 510, 520, 530 and 540. Each tap receives an adjustable current quantity $w_i$ representing the magnitude of a tap coefficient from the current steering unit 340, and a sign bit $q_i$ from the shift register 205 representing the sign of the coefficient. Differential signals representing a series of four data bit signals are input to the taps. In an embodiment, the FIR driver 330 has a transfer function which outputs differential signals DN and DP representing a current bit in relation to a weighted sum of the values of a series of data bits $x_1, x_0, x_{-1}$, and $x_{-2}$ input thereto from the serializer 320 (FIG. 3). The weighting is determined by the coefficients applied to the taps through currents $w_i$ and the sign bits $q_i$. The bit $x_0$ is the logic value of a current bit to be transmitted, $x_1$ is the logic value of a future bit, and $x_{-1}$ and $x_{-2}$ are logic values of past bits in the series of bits input to the FIR driver 330. Thus, the future bit $x_1$ is applied only to a tap 510, the current bit $x_0$ only to a tap 520, and the past bits $x_{-1}$ and $x_{-2}$ are applied only to the taps 530 and 540, respectively.

Each tap of the FIR driver 330 includes an XOR (exclusive OR) gate, a predriver unit (PDRV), and a driver unit (DRV). All of these elements receive differential signal input and provide differential signal output. The sign bit q is applied to the XOR gate, which then provides differential signal output to the PDRV unit in accordance thereto. That is, when the sign bit indicates a positive sign, the output of PDRV is non-inverted. However, when the sign bit indicates a negative sign, the output of PDRV is inverted. The predriver (PDRV) is used to increase the amplitude and current strength of the XOR output to a level suitable for use by the driver (DRV). The driver (DRV) then applies the adjustable current quantity $w_i$ to amplify the differential signal output of the PDRV by the magnitude of the tap coefficient. The outputs of the DRV circuits of all the taps 510, 520, 530, and 540 are tied together to produce a weighted sum of a series of input data bits, for transmission as differential signals DN and DP representing the current bit.

Figure 6:
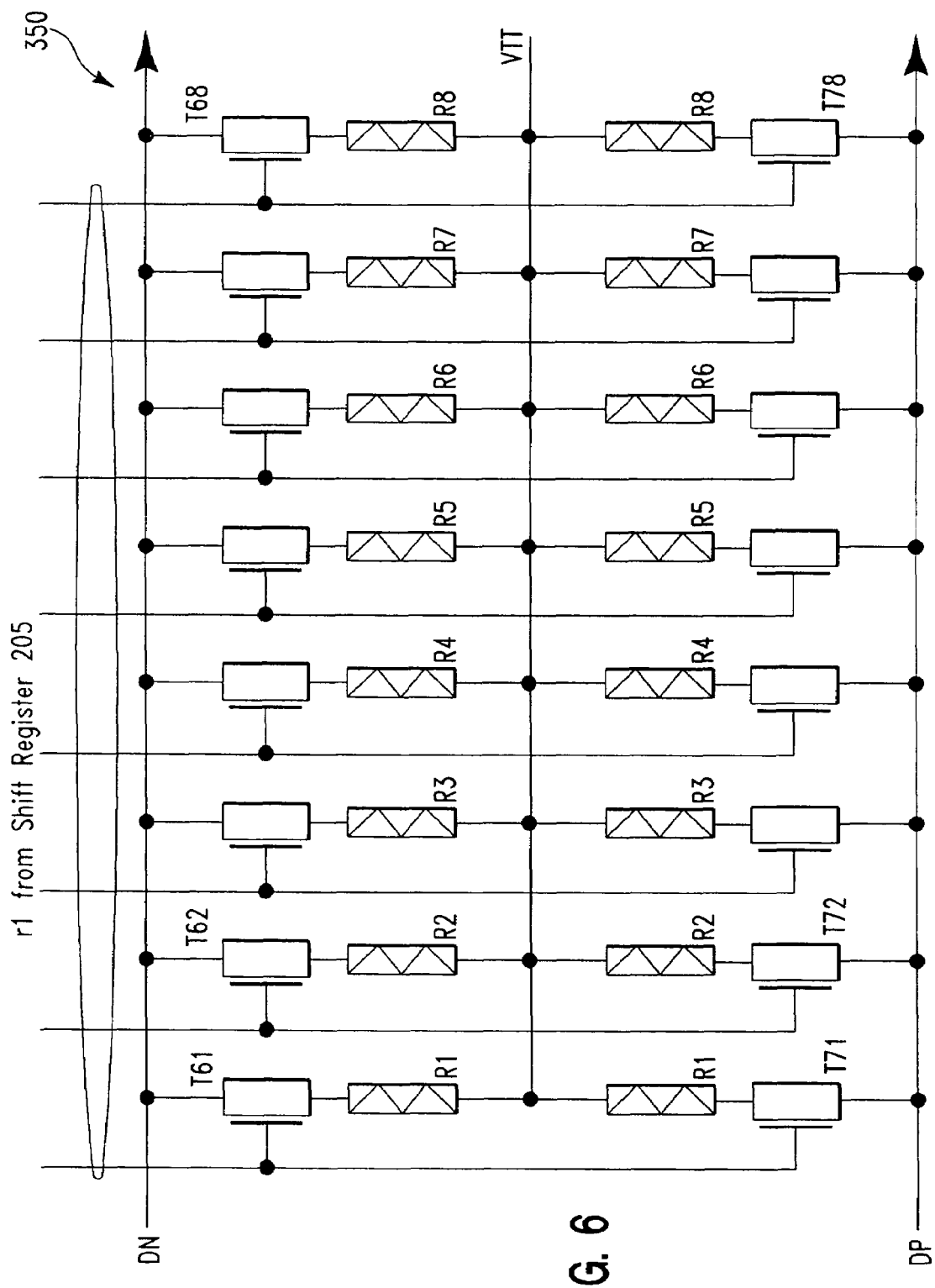
FIG. 6 is a schematic diagram illustrating a termination network component of a data transmitter according to an embodiment of the invention.

A schematic diagram illustrating the termination network 350 is provided in FIG. 6. As stated above, the termination network and the impedance matching network operate to apply a matching impedance to the conductive lines which carry the differential output signals DN and DP of the FIR transmitter 330. In the particular embodiment shown in FIG. 6, the termination network 350 includes only impedance elements having primarily a resistive impedance, i.e. resistors. In such embodiment, the impedance matching network 360 (FIG. 7) desirably includes only impedance elements having primarily a reactive impedance, i.e. inductors and capacitors. Both resistive and reactive impedance elements are required for proper impedance matching.

By having only resistive elements in the termination network 350, a regular layout can be used, which conserves area of an integrated circuit in which the termination network is implemented. The termination network includes two sets of resistors R1 through R8 and two corresponding sets of resistors T61 through T68 and T71 through T78. Each one of the resistors R1 through R8 is coupled at one end to the voltage supply VTT, and is coupled at another end to a corresponding one of the transistors T61 through T68, or T71 through T78. Each transistor, in turn, is coupled to one of the signal conductors for DN and DP. The operation of each transistor is controlled by a set of r1×n control bits output from the shift register 205. In the embodiment illustrated in FIG. 6, wherein n equals four, r1 equals two such that eight control bits are used to control switching of the transistors.

In such termination network 350, each pair of resistors R1 through R8 are capable of being selectively coupled to the signal conductors for DN and DP to provide terminating resistances. Depending on the granularity and the total range of variation needed, the values R1 through R8 can each have the same resistance value, or the resistances can vary in a series from small to large values. Alternatively, a combination of resistors having the same value and larger valued resistors having different values can be provided. Using such termination network 350, at least eight, and more preferably, many levels of resistances can be applied to terminate the signal conductors for DN and DP.

Figure 7:
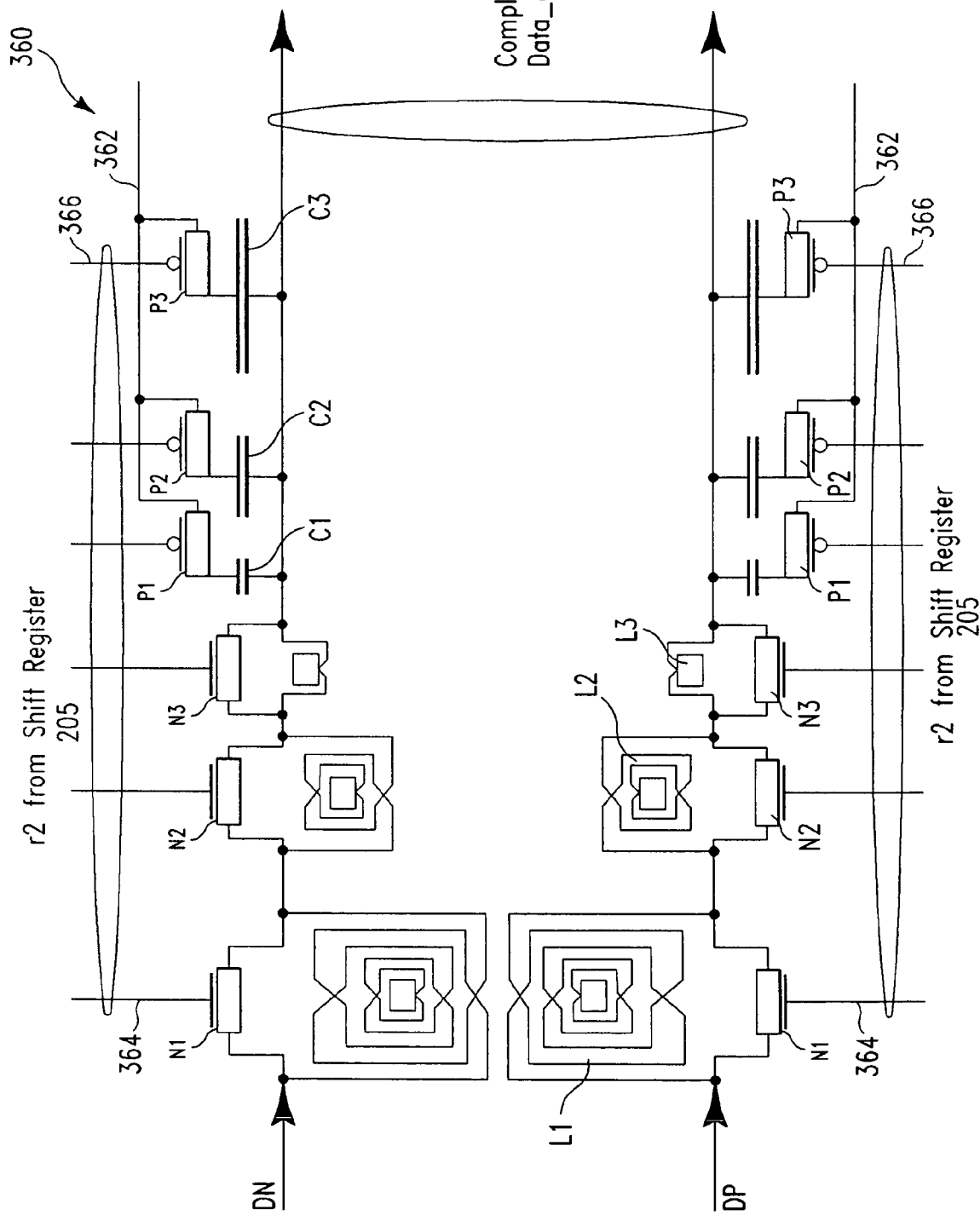
FIG. 7 is a schematic diagram illustrating an impedance matching network component of a data transmitter according to an embodiment of the invention.

FIG. 7 is a schematic diagram illustrating the impedance matching network 360. A variety of ways can be used to provide impedance matching to transmission lines carrying high-speed data signals, among which are the programmable adjustment methods described in co-pending, commonly owned U.S. patent application Ser. No. 10/250,177 filed Jun. 10, 2003. This application is hereby incorporated by reference herein.

The impedance matching network includes two sets of inductors L1 through L3 having a range of inductance values, and two sets of capacitors C1 through C3 having a range of capacitance values. Preferably, each one of the inductors in each set of inductors has a different value from the other inductors in the set. Preferably, each one of the capacitors in each set of capacitors has a different value from the other capacitors in each set. For each signal conductor DN and DP, two corresponding sets of transistors N1 through N3, and P1 through P3 are provided. The transistors N1 through N3, and P1 through P3 are operated by r2×n control inputs outputted by the shift register 205. As controlled by the r2 control inputs, the transistors N1 to N3 selectively connect the inductors L1 to L3 in series with the signal conductors for DN and DP. That is, a first control input 364 is used by transistors N1 to select whether inductors L1 are placed in series with the signal conductors for DN and DP. The transistors P1 through P3 selectively connect the capacitors C1 to C3 to the signal conductors for DN and DP. The capacitors are connected in shunt relation to a common potential 362, which may either be ground or a power supply voltage. For example, a control input 366 is used by transistors P3 to select whether capacitors P3 are connected in shunt relation to the signal conductors for DN and DP. Such arrangement permits the reactive impedance presented to the signal conductors DN and DP to be tuned by control inputs provided to the impedance matching network 360 from the shift register.

The foregoing described data transmitter and data transmission method provide improved ways for transmitting data in the face of variable attenuation that is difficult to predict or cannot be predicted. Use of a finite impulse response (FIR) driver and the storage of control information in a rewriteable non-volatile storage improve transmission versatility and can reduce power and time consumption when powering up the FIR driver.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A data transmitter, comprising:
    an adaptive finite impulse response (FIR) driver having a plurality of taps to which a plurality of coefficients having updateable values are applied, said FIR driver having a transfer function between an input stream of data bits and an output stream of data bits such that each data bit output from said FIR driver has an amplitude adjusted as a function of the values of a plurality of the data bits of the input stream, and the values of the coefficients;
    rewriteable non-volatile storage;
    a register operable to hold control information representing updated values of the plurality of coefficients as undated during operation of the FIR driver and to output the control information to apply the undated values to said plurality of taps of said FIR driver;
    a controller operable to store the control information from the register to the rewriteable non-volatile storage and retrieve the stored control information from the rewriteable non-volatile storage to the register upon powering up said FIR driver, such that, upon powering up said FIR driver, the updated values of the plurality of coefficients are applied to said plurality of taps from the control information stored in said rewriteable non-volatile storage.

2. The data transmitter of claim 1 further comprising a power adjustment unit, said power adjustment unit being responsive to selection input retrieved from said rewriteable non-volatile storage to adjust a power level of said data transmitter.

3. The data transmitter of claim 1 wherein the plurality of coefficients are applied to the plurality of taps of said FIR driver as currents having magnitudes adjustable in relation to the control information.

4. The data transmitter of claim 1 wherein the output stream of data bits is a serial stream and said FIR driver outputs the output stream of data bits as differential signals.

5. The data transmitter of claim 1 wherein said rewriteable non-volatile storage includes a non-volatile random access memory (NVRAM) selected from the group consisting of flash memory, metal-oxide-nitride-oxide-silicon (MONOS) memory, Chalcognide RAM and MRAM.

6. The data transmitter of claim 5 wherein said NVRAM is provided as an embedded element on an integrated circuit chip on which said FIR driver is provided.

7. The data transmitter of claim 5 wherein said NVRAM is provided on a first integrated circuit chip of a package containing a second integrated circuit chip on which said FIR driver is provided.

8. The data transmitter of claim 1 wherein said FIR driver includes a current steering unit operable in response to the control information output from the register to produce a plurality of currents having adjustable magnitudes to be applied to the plurality of taps of said FIR driver.

9. The data transmitter of claim 1 further comprising an impedance matching network operable to match an impedance of conductors coupled to carry the output stream of data bits, said impedance matching network including a plurality of independently selectable impedance elements including independently selectable reactance elements, the impedance elements being selectable in response to selection input, the selection input subject to modification during operation of said data transmitter.

10. The data transmitter of claim 9 wherein said reactance elements include inductors and capacitors.

11. The data transmitter of claim 9 wherein said rewriteable non-volatile storage is operable to rewriteably store the selection input.

12. A data transmitter, comprising:
    an adaptive finite impulse response (FIR) driver having a plurality of taps to which a plurality of coefficients having updateable values are applied, said FIR driver having a transfer function between an input stream of data bits and an output stream of data bits such that each data bit output from said FIR driver has an amplitude adjusted as a function of the values of a plurality of the data bits of the input stream, and the values of the coefficients;
    rewriteable non-volatile storage, operable to be rewritten with control information representing the values of the coefficients updated during operation of said FIR driver, such that the undated values are applied to the plurality of taps from the control information stored in the rewriteable non-volatile storage; and
    a termination network adapted to terminate conductors coupled to carry the output stream of data bits, the termination network including a plurality of independently selectable terminating impedances, the terminating impedances being selectable in response to termination selection input, the termination selection input being subject to modification during operation of said data transmitter.

13. The data transmitter of claim 12 wherein said rewriteable non-volatile storage is operable to be rewritten with the termination selection input.

14. A method of transmitting a stream of data bit signals each having an amplitude adjusted in relation to the values of the data bits being transmitted, comprising:
- applying an input stream of data bits to an input of an adaptive finite impulse response (FIR) driver, said FIR driver including a plurality of taps to which a plurality of coefficients having updateable values are applied;
- driving data bit signals by said FIR driver at amplitudes determined as a function of the values of a plurality of the data bits input to said FIR driver and the values of the coefficients;
- updating values of the plurality of coefficients applied to said plurality of taps during operation of said FIR driver;
- storing control information representing the updated values of the plurality of coefficients in a register;
- storing the control information from the register to a rewriteable non-volatile storage;
- retrieving the stored control information from the rewriteable non-volatile storage to the register upon powering up said FIR driver; and
- using the retrieved control information in the register, applying the updated values of the plurality of coefficients to said plurality of taps.

15. The method of claim 14 wherein the control information includes a plurality of current steering control bits, said method further comprising applying the current steering control bits to a current steering unit to provide a plurality of currents having adjustable magnitudes to the plurality of taps of said FIR driver, and driving the data bits output by said FIR driver at amplitudes at least partly determined by the adjustable magnitudes of the plurality of currents.

16. The method of claim 15, wherein the control information includes the current steering control bits.

17. The method of claim 14 wherein said rewriteable non-volatile storage includes a non-volatile random access memory (NVRAM) selected from the group consisting of flash memory, metal-oxide-nitride-oxide-silicon (MONOS) memory, Chalcognide RAM and MRAM.

18. The method of claim 17 wherein said NVRAM is provided as an element selected from the group consisting of a) an embedded NVRAM in an integrated circuit chip on which said FIR driver is provided, and b) an element of a first integrated circuit chip of a package containing a second integrated circuit chip on which said FIR driver is provided.

19. The method of claim 14, wherein the undated values of the plurality of coefficients are applied to the plurality of taps by generating a plurality of currents representing the values of the plurality of coefficients from the control information stored in the register.

20. The method of claim 14, wherein said step of driving includes driving the data bit signals by said FIR driver serially as a pair of differential signals.

21. The method of claim 14, wherein the input stream of data bits is applied to said input of said FIR driver as a plurality of pairs of differential signals.

22. The method of claim 14 further comprising providing a termination network coupled to conductors coupled to carry the output of said FIR driver, the termination network including a plurality of independently selectable impedances, storing termination control information in the rewriteable non-volatile storage, storing the termination control information to the register from the termination control information stored in the rewriteable non-volatile storage, and terminating the conductors by selecting ones of the independently selectable impedances according to the termination control information stored in the register.

23. The method of claim 14 further comprising providing an impedance matching network coupled to conductors coupled to carry the output of said FIR driver, the impedance matching network including a plurality of independently selectable impedance elements including reactance elements, storing impedance matching control information in the rewriteable non-volatile storage, storing the impedance matching control information to a register from the impedance matching control information stored in the rewriteable non-volatile storage, and matching an impedance of a network including the conductors by selecting ones of the independently selectable impedance elements according to the impedance matching control information stored in the register.

24. The method of claim 14, wherein said step of driving includes serially driving the data bit signals by said FIR driver.

* * * * *